United States Patent
Hoshikawa (10) Patent No.: US 12,336,111 B2
(45) Date of Patent: Jun. 17, 2025

(54) HOLDER MANAGEMENT DEVICE AND DISPLAY METHOD

(71) Applicant: FUJI CORPORATION, Chiryu (JP)

(72) Inventor: Kazumi Hoshikawa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 736 days.

(21) Appl. No.: 17/762,990

(22) PCT Filed: Sep. 24, 2019

(86) PCT No.: PCT/JP2019/037167
§ 371 (c)(1),
(2) Date: Mar. 23, 2022

(87) PCT Pub. No.: WO2021/059319
PCT Pub. Date: Apr. 1, 2021

(65) Prior Publication Data
US 2022/0338395 A1    Oct. 20, 2022

(51) Int. Cl.
*H05K 13/04*    (2006.01)
*B65G 1/137*    (2006.01)
*H05K 13/08*    (2006.01)

(52) U.S. Cl.
CPC .......... *H05K 13/086* (2018.08); *B65G 1/137* (2013.01)

(58) Field of Classification Search
CPC ............. H05K 13/086; H05K 13/0408; H05K 13/0409; B65G 1/137
See application file for complete search history.

(56) References Cited

U.S. PATENT DOCUMENTS

2017/0303449 A1    10/2017    Tsuge

FOREIGN PATENT DOCUMENTS

| CN | 106797713 A | 5/2017 |
| EP | 2 916 637 A1 | 9/2015 |
| JP | 2013-8729 A | 1/2013 |
| WO | WO 2014/068673 A1 | 5/2014 |
| WO | WO 2018/109921 A1 | 6/2018 |

OTHER PUBLICATIONS

International Search Report mailed on Jan. 7, 2020 in PCT/JP2019/037167 filed on Sep. 24, 2019, (2 pages).

*Primary Examiner* — Mark A Connolly
(74) *Attorney, Agent, or Firm* — Oblon, McClelland, Maier & Neustadt, L.L.P.

(57) ABSTRACT

A holder management device includes a storage device to store a tray that accommodates a component holder and a work machine that performs work using the component holder, a placement section on which the tray is placed, a transfer device to transfer the component holder used in the work machine stored in the storage device in correlation with the tray to the tray placed on the placement section, and a display device to display information indicating a tray to be placed on the placement section together with information indicating a work machine stored in the storage device in correlation with the tray, and in a case where the storage device stores multiple types of trays and work machines in correlation with each other, to display information indicating the multiple types of trays together with information indicating the work machines stored in the storage device.

5 Claims, 10 Drawing Sheets

HOLDER MANAGEMENT DEVICE AND DISPLAY METHOD

TECHNICAL FIELD

The present disclosure relates to a holder management device or the like including a transfer device that transfers a component holder to a tray placed on a placement section.

BACKGROUND ART

Among some holder management devices including a transfer device that transfers a component holder to a tray placed on a placement section, there is a holder management device in which the name of a tray to be placed on the placement section is displayed on a display device in order to notify an operator of the tray to be placed on the placement section. An example of such a holder management device is disclosed in the following Patent Literature.

PATENT LITERATURE

Patent Literature 1: International Publication No. WO2014/068673

BRIEF SUMMARY

Technical Problem

An object of the present specification is to appropriately display the name of a tray to be placed on a placement section on a display device.

Solution to Problem

In order to achieve the object, according to the present specification, there is provided a holder management device including a storage device configured to store a tray in which a component holder is accommodated and a work machine that performs work by using the component holder accommodated in the tray in correlation with each other; a placement section on which the tray is placed; a transfer device configured to transfer the component holder used in the work machine stored in the storage device in correlation with the tray to the tray placed on the placement section; and a display device configured to display information indicating a tray to be placed on the placement section together with information indicating a work machine stored in the storage device in correlation with the tray, and in a case where the storage device stores multiple types of trays and work machines in correlation with each other, to display information indicating the multiple types of trays together with information indicating the work machines stored in the storage device in correlation with the multiple types of trays.

According to the present specification, there is provided a display method in a holder management device including a storage device configured to store a tray in which a component holder is accommodated and a work machine that performs work by using the component holder accommodated in the tray in correlation with each other, a placement section on which the tray is placed, a display device configured to display information indicating a tray to be placed on the placement section together with information indicating a work machine stored in the storage device in correlation with the tray, and a transfer device configured to transfer the component holder used in the work machine stored in the storage device in correlation with the tray to the tray placed on the placement section, the display method including displaying, in a case where the storage device stores multiple types of trays and work machines in correlation with each other, information indicating the multiple types of trays together with information indicating the work machines stored in the storage device in correlation with the multiple types of trays on the display device.

Advantageous Effects Effect of the Invention

According to the present disclosure, the information indicating the multiple types of trays is displayed on the display device. Therefore, since any tray among the multiple types of trays can be placed on the placement section, the efficiency is improved by increasing the number of options for an operator. Consequently, it is possible to appropriately display information indicating a tray to be placed on the placement section on the display device.

DESCRIPTION OF EMBODIMENTS

Hereinafter, preferred embodiments of the present disclosure will be described in detail with reference to the drawings.

Figure 1:
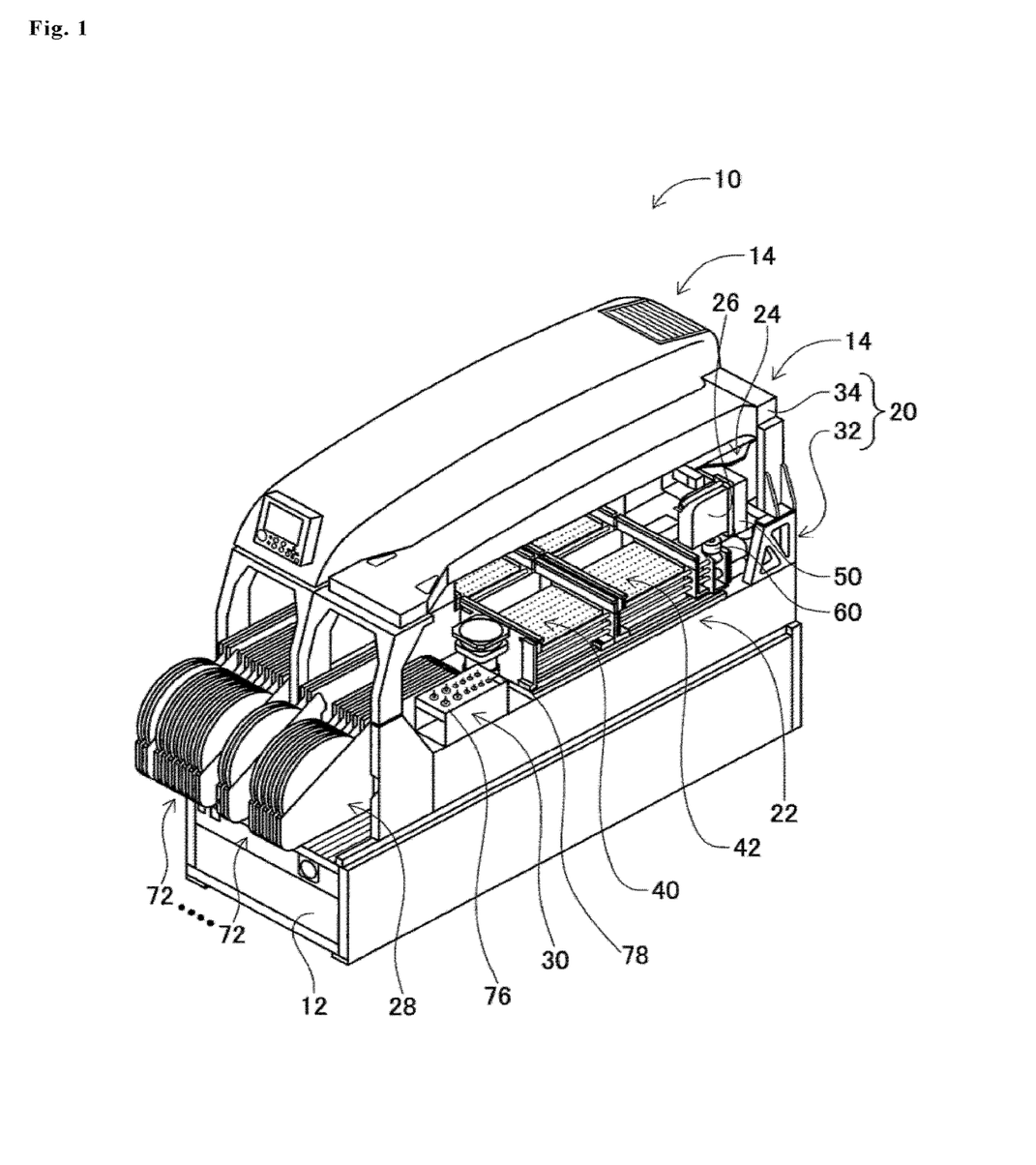
FIG. 1 is a perspective view illustrating an electronic component mounting device.

FIG. 1 illustrates electronic component mounting device 10. First, a configuration of electronic component mounting device 10 will be described. Electronic component mounting device 10 includes single system base 12 and two electronic component mounters (hereinafter, sometimes abbreviated to "mounters") 14 adjacent above system base 12. A direction in which mounters 14 are arranged will be referred to as an X-axis direction, and a horizontal direction perpendicular to the X-axis direction will be referred to as a Y-axis direction.

Each mounter 14 mainly includes mounter main body 20, conveyance device 22, mounting head moving device (hereinafter, sometimes abbreviated to a moving device) 24, mounting head 26, supply device 28, and nozzle station 30. Mounter main body 20 includes frame 32 and beam 34 that is suspended on frame 32.

Conveyance device 22 includes two conveyor devices 40 and 42. Two conveyor devices 40 and 42 are disposed parallel to each other and in such a manner as to extend in the X-axis direction on frame 32. Each of two conveyor devices 40 and 42 conveys a circuit board supported at each of conveyor devices 40 and 42 in the X-axis direction with an electromagnetic motor (not illustrated). The circuit board is held by a board holding device (not illustrated) at a predetermined position.

Moving device 24 is an XY-robot type moving device. Moving device 24 includes an electromagnetic motor (not illustrated) for sliding slider 50 in the X-axis direction, and an electromagnetic motor (not illustrated) for sliding slider 50 in the Y-axis direction. Mounting head 26 is attached to slider 50, and mounting head 26 is moved to any position on frame 32 due to an operation of two electromagnetic motors.

Figure 2:
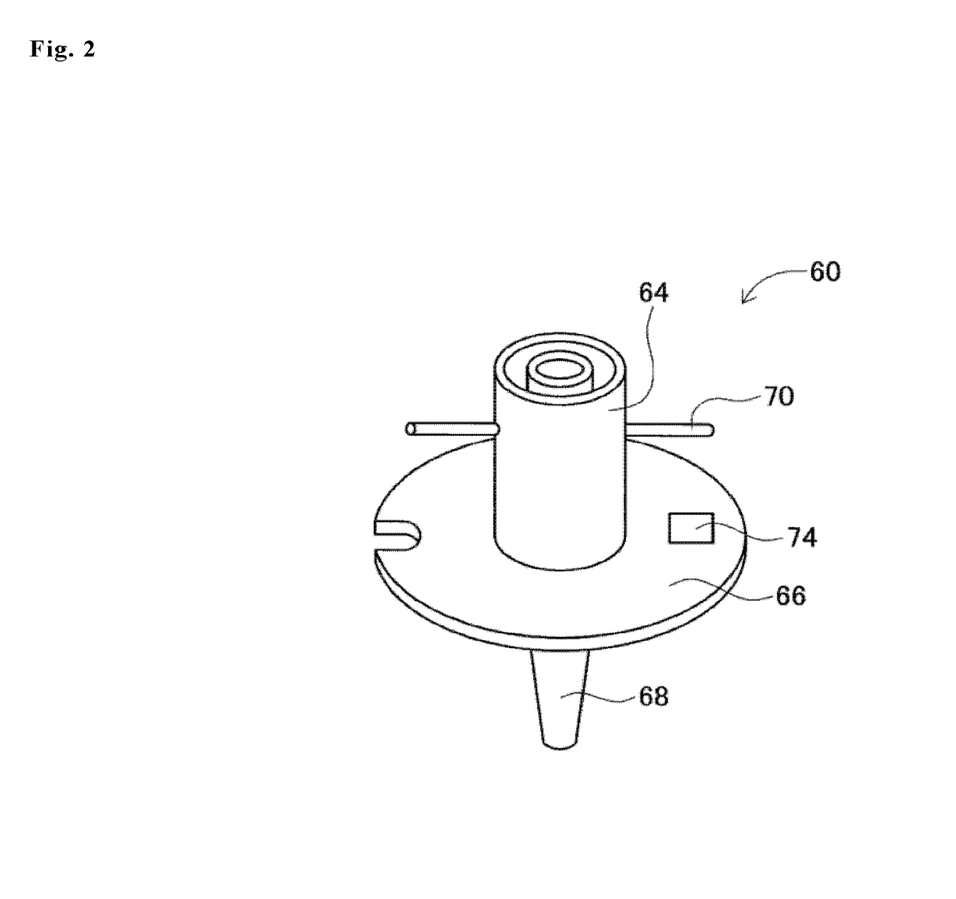
FIG. 2 is a perspective view illustrating a suction nozzle.

Mounting head 26 mounts an electronic component on a circuit board. Suction nozzle 60 is provided at a lower end face of mounting head 26. As illustrated in FIG. 2, suction nozzle 60 is configured by body cylinder 64, flange portion 66, suction pipe 68, and locking pin 70. Body cylinder 64 has a cylindrical shape, and flange portion 66 is fixed to protrude from an outer circumferential surface of body cylinder 64. Suction pipe 68 has a thin pipe shape, and is held by body cylinder 64 so as to be movable in an axial direction in a state of extending downward from a lower end part of body cylinder 64. Locking pin 70 is provided at an upper end part of body cylinder 64 so as to extend in a radial direction of body cylinder 64. Suction nozzle 60 is detachably attached to mounting head 26 by one touch by using locking pin 70. A spring (not illustrated) is built into mounting head 26, and the spring applies elastic force to suction pipe 68 of suction nozzle 60 attached to mounting head 26. Consequently, suction pipe 68 is biased in a direction extending downward from the lower end part of body cylinder 64 by the elastic force of the spring built into mounting head 26. 2D code 74 is attached to an upper surface of flange portion 66. 2D code 74 indicates an identification (ID) or the like of suction nozzle 60 as individual information. Instead of 2D code 74, a barcode or an RF tag may be attached to the upper surface of flange portion 66. However, in a case where the RF tag is attached to the upper surface of flange portion 66, a reader for acquiring individual information from the RF tag is attached to transfer head (refer to FIG. 4) 120 of nozzle management device (refer to FIG. 3) 80 that will be described later.

Suction nozzle 60 communicates with positive and negative pressure supply devices (not illustrated) via a negative pressure air passage and a positive pressure air passage. Suction nozzle 60 picks up and holds an electronic component by using a negative pressure, and separates the held electronic component by using a positive pressure. Mounting head 26 has a nozzle lifting/lowering device (not illustrated) that lifts and lowers suction nozzle 60. The nozzle lifting/lowering device changes a position of the electronic component held by mounting head 26 in the up-down direction.

Supply device 28 is a feeder-type supply device, and includes multiple tape feeders 72 as illustrated in FIG. 1. Tape feeder 72 accommodates taped components that are wound therearound. The taped component is obtained by taping an electronic component. Tape feeder 72 causes a feeding device (not illustrated) to feed the taped component. Consequently, feeder-type supply device 28 supplies an electronic component at a supply position by feeding a taped component.

Nozzle station 30 includes nozzle tray 76. Nozzle tray 76 accommodates multiple suction nozzles 60. In nozzle station 30, suction nozzle 60 attached to mounting head 26 and suction nozzle 60 accommodated in nozzle tray 76 are exchanged as required. 2D code 78 is attached to an upper surface of nozzle tray 76. 2D code 78 indicates an identification (ID) or the like of nozzle tray 76 as individual information. Instead of 2D code 78, a barcode or an RF tag may be attached to the upper surface of nozzle tray 76. However, in a case where an RF tag is attached to the upper surface of nozzle tray 76, a reader for acquiring individual information from the RF tag is attached to transfer head (refer to FIG. 4) 120 of nozzle management device (refer to FIG. 3) 80 that will be described later. Nozzle tray 76 is detachable from nozzle station 30, and thus collection of suction nozzle 60 accommodated in nozzle tray 76, provision of suction nozzle 60 to nozzle tray 76, and the like can be performed outside mounter 14.

Next, mounting work using mounter 14 will be described. In mounter 14, with the configuration described above, mounting work can be executed on a circuit board held by conveyance device 22 by using mounting head 26. Specifically, a circuit board is conveyed to a work position according to a command from a control device (not illustrated) of mounter 14, and is held by the board holding device at that position. Tape feeder 72 feeds a taped component according to a command from the control device, and supplies an electronic component at a supply position. Mounting head 26 is moved above the supply position of the electronic component, and picks up and holds the electronic component by using suction nozzle 60. Subsequently, mounting head 26 is moved above the circuit board, and mounts the electronic component held thereby on the circuit board.

In mounter 14, as described above, an electronic component supplied by tape feeder 72 is picked up and held by suction nozzle 60, and thus the electronic component is mounted on the circuit board. Thus, in order to perform the mounting work in mounter 14 by using suction nozzle 60 corresponding to a size, a shape, and the like of an electronic component that is a mounting target on a circuit board, it is necessary to accommodate suction nozzle scheduled to be used in the mounting work in nozzle tray 76 as a setup change task before the mounting work is performed. Therefore, in the nozzle management device described below, the suction nozzle scheduled to be used in the mounting work is accommodated in nozzle tray 76.

Figure 3:
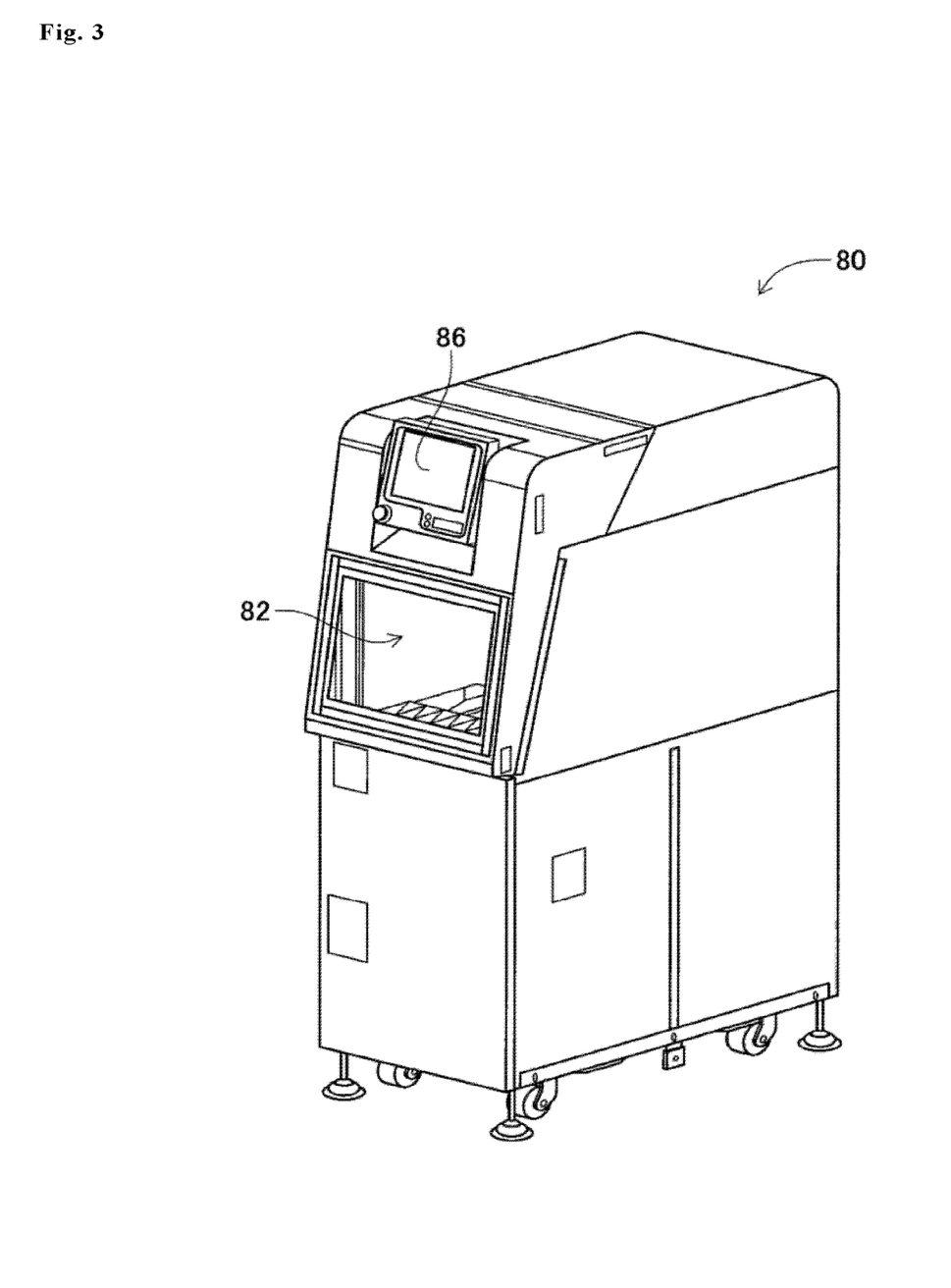
FIG. 3 is a perspective view illustrating an external appearance of a nozzle management device.

Next, a configuration of the nozzle management device will be described. As illustrated in FIG. 3, nozzle management device 80 has a generally rectangular parallelepiped shape, and is provided with door 82 through which nozzle tray 76 is stored in nozzle management device 80 or nozzle tray 76 is extracted from nozzle management device 80 on a front surface thereof. Touch panel 86 or the like that displays various pieces of information and is used to perform each operation is disposed above door 82.

Figure 4:
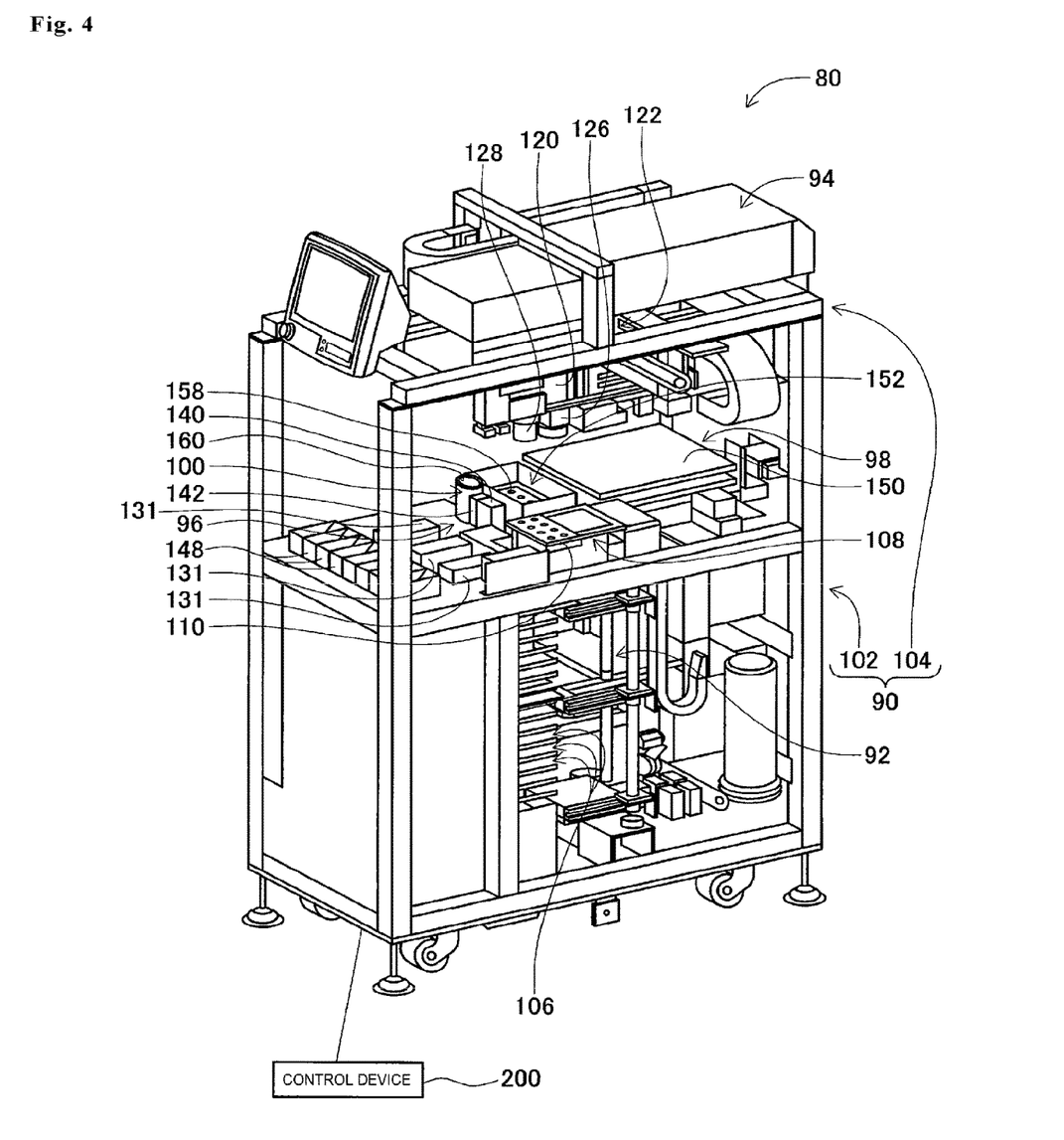
FIG. 4 is a perspective view illustrating an internal structure of the nozzle management device.

As illustrated in FIG. 4, nozzle management device 80 includes management device main body 90, pallet accommodation device 92, nozzle transfer device 94, nozzle inspection device 96, nozzle cleaning device 98, and nozzle drying device 100. FIG. 4 is a perspective view illustrating a state in which an outer shell member of nozzle management device 80 is detached, and illustrates an internal structure of nozzle management device 80. Control device 200 is connected to nozzle management device 80. Details of control device 200 will be described later.

Management device main body 90 includes frame 102 and beam 104 suspended on frame 102. Frame 102 has a hollow structure, pallet accommodation device 92 is disposed in frame 102, and an upper end part of pallet accommodation device 92 is exposed on an upper surface of frame 102.

Pallet accommodation device 92 includes multiple pallet placement shelves 106 and support arm 108. Pallet placement shelf 106 is a shelf on which nozzle pallet 110 is placed, and multiple pallet placement shelves 106 are disposed to be arranged in the up-down direction inside frame 102. Nozzle pallet 110 accommodates multiple suction nozzles 60. Support arm 108 is moved in the up-down direction ahead of multiple pallet placement shelves 106 and approaches and separates from pallet placement shelves 106 due to an operation of an arm moving device (not illustrated). Consequently, storage of nozzle pallet 110 into pallet placement shelf 106 and extraction of nozzle pallet 110 from pallet placement shelf 106 are performed by support arm 108. Nozzle pallet 110 extracted from pallet placement shelf 106 is moved above frame 102 due to upward movement of support arm 108.

Nozzle transfer device 94 is a device that transfers suction nozzle 60 between nozzle tray 76 and nozzle pallet 110, and is disposed in beam 104. Nozzle transfer device 94 includes transfer head 120 and head moving device 122. Camera 126 in a state of facing downward and holding chuck 128 that holds suction nozzle 60 are attached to a lower end face of transfer head 120. Holding chuck 128 has two holding pawls (not illustrated), and by causing two holding pawls 132 to approach each other, suction nozzle 60 is held in body cylinder 64, and by causing the two holding pawls to separate from each other, held suction nozzle 60 is released.

Head moving device 122 is an XYZ type moving device that moves transfer head 120 in the front-rear direction, the left-right direction, and the up-down direction on frame 102. Three fixing stages 131 for setting nozzle tray 76 are provided on an upper surface of the front side of frame 102, and suction nozzle 60 is transferred between nozzle tray 76 set on fixing stage 131 and nozzle pallet 110 supported by support arm 108 of pallet accommodation device 92.

Nozzle inspection device 96 includes camera 140 and load cell 142. Camera 140 is disposed on the upper surface of frame 102 so as to face upward, and the tip portion of suction nozzle 60 is inspected by using camera 140. Specifically, suction nozzle 60 that is an inspection target is held by holding chuck 128, and suction nozzle 60 held by holding chuck 128 is imaged by camera 140 from below. Consequently, imaging data of the tip portion of suction nozzle 60 is obtained, and a state of the tip portion of suction nozzle 60 is inspected based on the imaging data.

Load cell 142 is disposed near camera 140, and expansion and contraction states of the tip portion of suction nozzle 60 are inspected by using load cell 142. Specifically, suction nozzle 60 that is an inspection target is held by holding chuck 128, and the tip portion of suction nozzle 60 held by holding chuck 128 comes into contact with load cell 142. As described above, the tip portion of suction nozzle 60 is allowed to expand and contract, and thus the expansion and contraction states of the tip portion of suction nozzle 60 are inspected based on a load measured by load cell 142.

Multiple discard boxes 148 are disposed on the upper surface of frame 102, and suction nozzle 60 determined as being a defective nozzle through the inspection is discarded into discard box 148. Suction nozzle 60 determined as being a normal nozzle through the above inspection is returned to nozzle tray 76 or nozzle pallet 110.

Nozzle cleaning device 98 is a device that cleans and dries suction nozzle 60, and is disposed near pallet accommodation device 92. Nozzle cleaning device 98 includes cleaning/drying mechanism 150 and cleaning pallet moving mechanism 152. Cleaning/drying mechanism 150 is a mechanism that cleans and dries suction nozzle 60 in the inside thereof. Cleaning pallet moving mechanism 152 is a mechanism that moves cleaning pallet 158 between an exposed position where cleaning pallet 158 is exposed (a position where cleaning pallet 158 is illustrated in FIG. 4) and the inside of cleaning/drying mechanism 150.

Nozzle drying device 100 is a device that dries suction nozzle 60, and is disposed near cleaning pallet 158 located at the exposed position. In nozzle cleaning device 98, although drying is also performed, moisture may remain inside suction nozzle 60. In particular, in suction nozzle 60, since body cylinder 64 and suction pipe 68 slide on each other, moisture may remain on a sliding surface between body cylinder 64 and suction pipe 68. Therefore, drying chamber 160 that is open above is provided in nozzle drying device 100, cleaned suction nozzle 60 is held by holding chuck 128, and suction nozzle 60 is inserted into drying chamber 160. An air blow device (not illustrated) is disposed in drying chamber 160, and air is blown by the air blow device to suction nozzle 60 inserted into the inside of drying chamber 160. Consequently, moisture on the sliding surface between body cylinder 64 and suction pipe 68 can be removed, and thus suction nozzle 60 can be appropriately dried.

Figure 5:
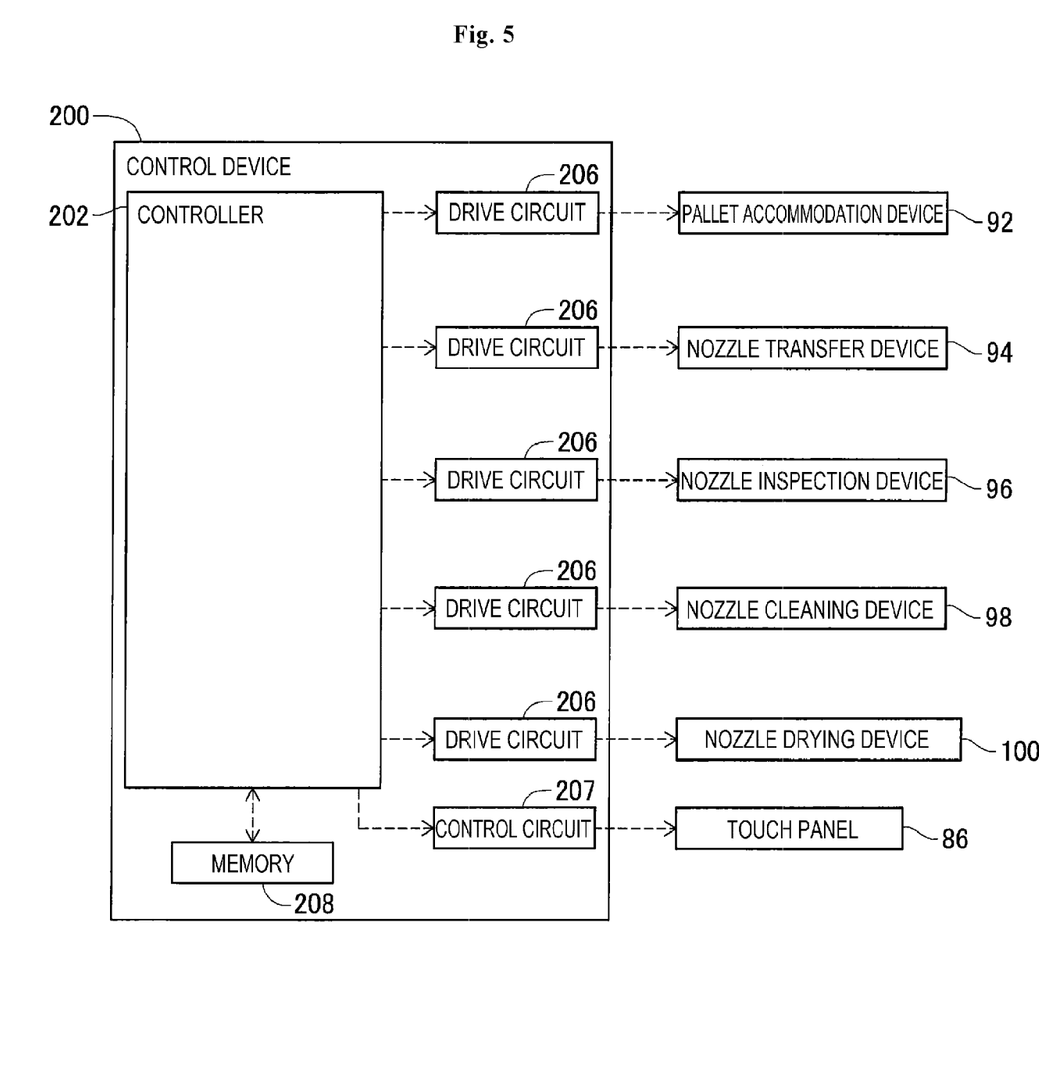
FIG. 5 is a block diagram illustrating a control device provided in the nozzle management device.

As illustrated in FIG. 5, control device 200 includes controller 202, multiple drive circuits 206, control circuit 207, and memory 208. Multiple drive circuits 206 are connected to pallet accommodation device 92, nozzle transfer device 94, nozzle inspection device 96, nozzle cleaning device 98, and nozzle drying device 100. Controller 202 includes CPU, ROM, RAM, and the like, and is mainly a computer, and is connected to multiple drive circuits 206. Consequently, operations of pallet accommodation device 92, nozzle transfer device 94, and the like are controlled by controller 202. Controller 202 is connected to touch panel 86 via control circuit 207. Consequently, any image is displayed on touch panel 86 by controller 202. Various types of information are stored in memory 208, and controller 202 is connected to memory 208. Consequently, controller 202 acquires various types of information from memory 208.

In nozzle management device 80, with the above-described configuration, a suction nozzle (hereinafter, referred to as a "nozzle required during work") scheduled to be used in the mounting work in mounter 14 or the like is accommodated in nozzle tray 76. Specifically, as described above, nozzle management device 80 is provided with nozzle inspection device 96, nozzle cleaning device 98, and nozzle drying device 100. Thus, suction nozzles that have been inspected by nozzle inspection device 96 and determined as being normal, and suction nozzles that have been cleaned and dried by nozzle cleaning device 98 and nozzle drying device 100 are accommodated in nozzle pallet 110. Nozzle pallet 110 in which the suction nozzles are accommodated is accommodated in pallet accommodation device 92.

Memory 208 of nozzle management device 80 stores information regarding a suction nozzle (hereinafter, referred to as "nozzle information") to be accommodated in nozzle tray 76 during the setup change task, that is, a nozzle required during work in a mounter that is a target of the setup change task. The nozzle information includes the number, type, and the like of nozzles required during work. The nozzle information is naturally stored for each mounter that is a target of the setup change task, and stores information indicating the mounter (hereinafter, referred to as "mounter information") that is a target of the setup change task in correlation with the nozzle information. The mounter information is also stored in correlation with information indicating a line (hereinafter, referred to as "line information") in which a mounter indicated by the mounter information is included and information indicating a product (hereinafter, referred to as "product information") to be created by the line.

Since a size, a type, or the like of suction nozzle 60 to be mounted on mounting head 26 differs according to the type of mounting head 26 disposed in each of multiple mounters, nozzle tray 76 in which suction nozzle 60 is accommodated also differs according to the type of mounting head 26. That is, the type of nozzle tray 76 differs for each mounter that is a target of the setup change task. Thus, memory 208 stores mounter information in correlation with information indicating nozzle tray 76 (hereinafter, referred to as "tray information") used in a mounter indicated by the mounter information.

Figure 6:
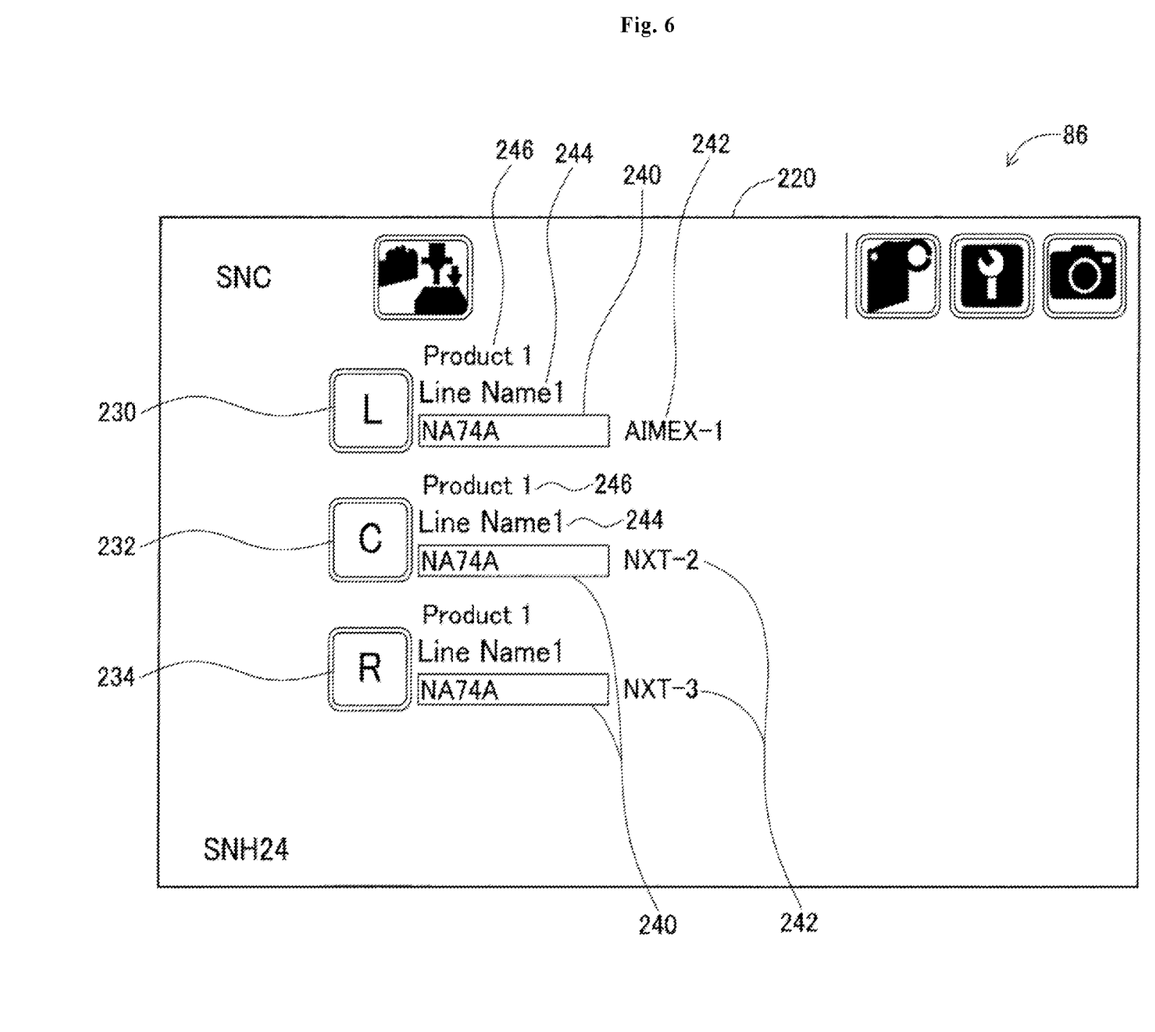
FIG. 6 is a diagram illustrating a setup change screen.

In nozzle management device 80, when work of accommodating a nozzle required during work in a mounter that is a target of the setup change task in nozzle tray 76 is executed, the name of nozzle tray 76 to be set in nozzle management device 80 is displayed on touch panel 86. Specifically, setup change screen 220 illustrated in FIG. 6 is displayed on touch panel 86. First selection button 230, second selection button 232, and third selection button 234 are displayed on setup change screen 220. Three selection buttons 230, 232, and 234 are buttons for selecting three fixing stages 131 for setting nozzle tray 76 in nozzle management device 80. First selection button 230 corresponds to fixing stage (hereinafter, referred to as a "left stage") 131 located on the leftmost side of three fixing stages 131. Second selection button 232 corresponds to fixing stage (hereinafter, referred to as a "center stage") 131 located at the center of three fixing stages 131. Third selection button 234 corresponds to fixing stage (hereinafter, referred to as a "right stage") 131 located on the rightmost side of three fixing stages 131.

Name 240 of nozzle tray 76 (hereinafter, referred to as a "tray name") to be set in fixing stage 131 corresponding to each of selection buttons 230, 232, and 234 is displayed on the right of each of selection buttons 230, 232, and 234. Together with tray name 240, name 242 of a mounter (hereinafter, referred to as a "mounter name") in which nozzle tray 76 having tray name 240 is set is also displayed. Mounter name 242 is the name of a mounter indicated by mounter information stored in memory 208 in correlation with tray information of nozzle tray 76 corresponding to tray name 240. Together with mounter name 242, name 244 of a line (hereinafter, referred to as a "line name") including the mounter having mounter name 242 and name 246 of a product (hereinafter, referred to as a "product name") to be created on the line are also displayed. Line name 244 and product name 246 are names of a line and a product indicated by the line information and the product information stored in memory 208 in correlation with the mounter information of the mounter corresponding to mounter name 242.

Specifically, "NA74A" is displayed as tray name 240, "AIMEX-1" is displayed as mounter name 242, "Line Name1" is displayed as line name 244, and "Product1" is displayed as product name 246 on the right of first selection button 230. "NA74A" is displayed as tray name 240, "NXT-2" is displayed as mounter name 242, "Line Name1" is displayed as line name 244, and "Product1" is displayed as product name 246 on the right of second selection button 232. "NA74A" is displayed as tray name 240, "NXT-3" is displayed as mounter name 242, "Line Name1" is displayed as line name 244, and "Product1" is displayed as product name 246 on the right of third selection button 234.

Therefore, for example, when an operator sets nozzle tray 76 having the name "NA74A" in left stage 131 corresponding to first selection button 230, a nozzle required during work in a work machine having the name "AIMEX-1" is accommodated in nozzle tray 76 set in left stage 131. For example, when the operator sets nozzle tray 76 having the name "NA74A" in center stage 131 corresponding to second selection button 232, a nozzle required during work in a work machine having the name of "NXT-2" is accommodated in nozzle tray 76 set in center stage 131. For example, when the operator sets nozzle tray 76 having the name of "NA74A" in right stage 131 corresponding to third selection button 234, a nozzle required during work in a work machine having the name of "NXT-3" is accommodated in nozzle tray 76 set in right stage 131.

The work of accommodating a nozzle required during work in nozzle tray 76 set in each fixing stage 131 is executed based on mounter information corresponding to mounter name 242 displayed at each of selection buttons 230, 232, and 234 corresponding to fixing stage 131. Specifically, for example, in a case where nozzle tray 76 having the name "NA74A" is set in center stage 131, since "NXT-2" is displayed as mounter name 242 at second selection button 232 corresponding to center stage 131, mounter information indicating the mounter having the name "NXT-2" is specified. The nozzle information stored in memory 208 in correlation with the mounter information is specified. The nozzle information includes information regarding the number, the type, and the like of nozzles required during work in the mounter having the name "NXT-2". Therefore, the suction nozzle indicated by the nozzle information is accommodated in nozzle tray 76 set in center stage 131 due to operations of pallet accommodation device 92, nozzle transfer device 94, and the like.

As described above, in nozzle management device 80, the operator sets nozzle tray 76 having tray name 240 displayed on setup change screen 220 in fixing stage 131 corresponding to selection button 230, 232, or 234 associated with tray name 240, suction nozzle 60 associated with the setup change task is accommodated in nozzle tray 76. However, when the operator executes the setup change task, nozzle tray 76 having tray name 240 displayed on setup change screen 220 may not be held at hand, but may have a nozzle tray having a name different from tray name 240. Specifically, for example, as illustrated in FIG. 6, although "NA74A" is displayed as tray name 240 at any of three selection buttons 230, 232, and 234 on setup change screen 220, the operator may not have nozzle tray 76 having the name "NA74A" at hand and may have nozzle tray 76 having the name "ND36C". In such a case, it is wasteful of time for the operator to intentionally take the nozzle tray having the name "NA74A". Thus, it is possible to change tray name 240 or the like displayed in correspondence to selection buttons 230, 232, and 234.

Figure 7:
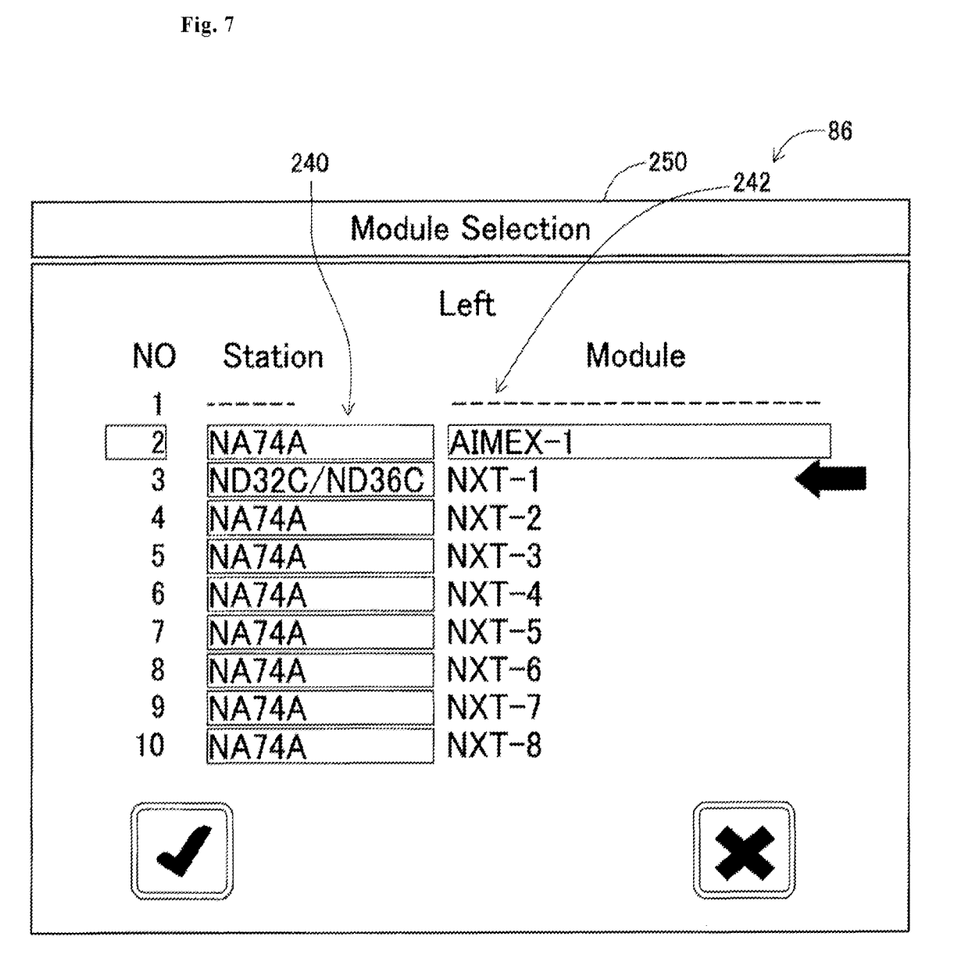
FIG. 7 is a diagram illustrating a change screen.

Specifically, for example, when the operator operates first selection button 230 on setup change screen 220, change screen 250 illustrated in FIG. 7 is displayed on touch panel 86 in place of setup change screen 220. Multiple mounter names 242 are displayed on change screen 250, and tray name 240 is displayed in correspondence to each of multiple mounter names 242. Specifically, for example, tray name 240 of "NA74A" is displayed in correspondence to mounter name 242 of "AIMEX-1", tray names 240 of "ND32C/ND36C" are displayed in correspondence to mounter name 242 of "NXT-1", and tray name 240 of "NA74A" is displayed in correspondence to mounter name 242 of "NXT-2". Tray name 240 is the name of a tray indicated by tray information stored in memory 208 in correlation with mounter information of a mounter associated with mounter name 242.

That is, for example, the mounter information of mounter name 242 of "AIMEX-1" is stored in memory 208 in correlation with the tray information of tray name 240 of "NA74A". Thus, on change screen 250, tray name 240 of "NA74A" is displayed in correspondence to mounter name 242 of "AIMEX-1". The mounter information of mounter name 242 of "NXT-1" is stored in memory 208 in correlation with the tray information of two types of tray names 240 of "ND32C" and "ND36C". Thus, on change screen 250, two types of tray names 240 of "ND32C" and "ND36C" are displayed in correspondence to mounter name 242 of "NXT-1".

Figure 8:
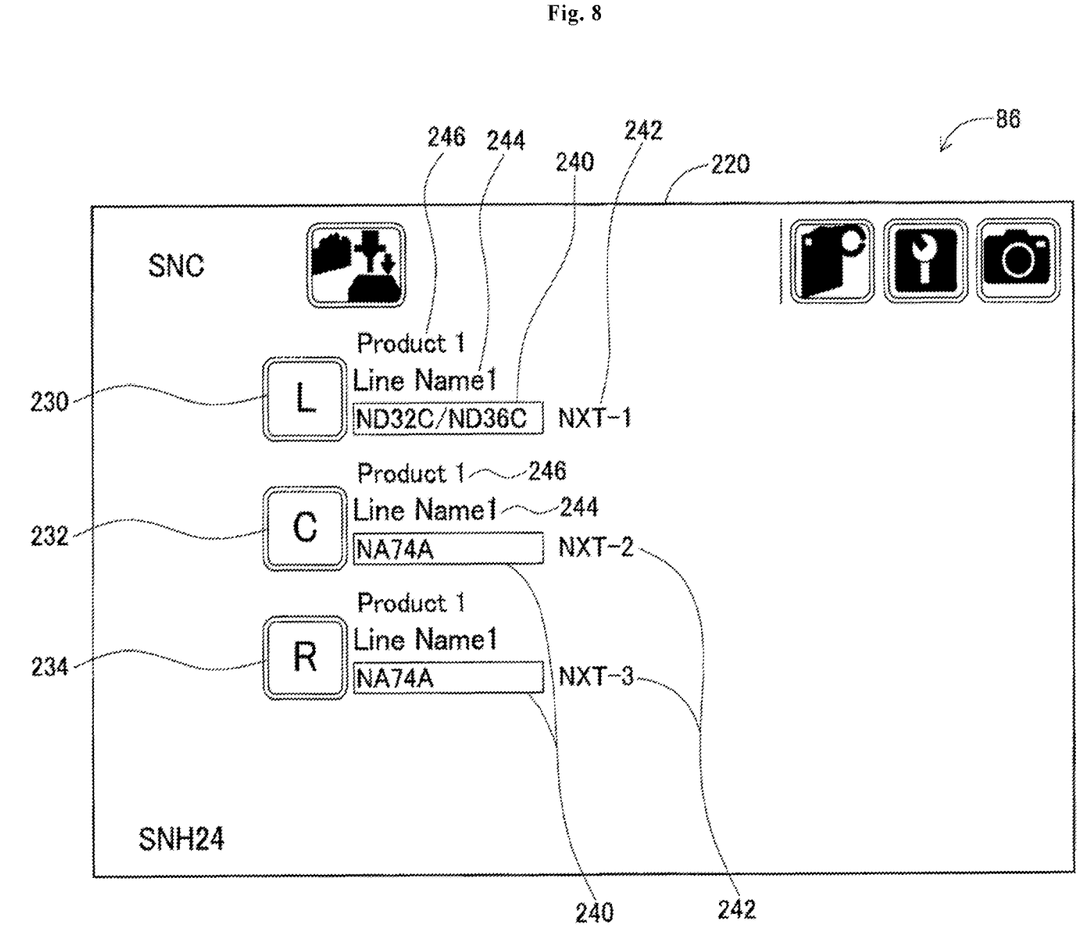
FIG. 8 is a diagram illustrating a setup change screen.

As described above, when multiple mounter names 242 and tray names 240 respectively corresponding to multiple mounter names 242 are displayed on change screen 250, the operator operates tray name 240 of nozzle tray 76 desired to be set by the operator. In this case, since the operator has nozzle tray 76 of "ND36C" as described above, the operator operates tray names 240 of "ND32C/ND36C". Consequently, setup change screen 220 illustrated in FIG. 8 is displayed on touch panel 86 instead of change screen 250. Tray name 240 selected through the operation on change screen 250 illustrated in FIG. 7 is displayed in correspondence to first selection button 230 on setup change screen 220. That is, tray names 240 of "ND32C/ND36C" are displayed in correspondence to first selection button 230 on setup change screen 220 illustrated in FIG. 8. Mounter name 242 of "NXT-1" is displayed in correspondence to tray names 240 of "ND32C/ND36C". This is because the tray information of "ND32C/ND36C" and the mounter information of "NXT-1" are stored in memory 208 in correlation with each other. Line name 244 of "Line Name1" and product name 246 of "Product1" are displayed in correspondence to mounter name 242 of "NXT-1". This is because the mounter information of "NXT-1", the line information of "Line Name1", and the product information of "Product1" are stored in memory 208 in correlation with each other.

When setup change screen 220 including tray names 240 of "ND32C/ND36C" are displayed on touch panel 86, the operator sets nozzle tray 76 of "ND36C" in left stage 131 corresponding to first selection button 230 associated with tray names 240 of "ND32C/ND36C". Consequently, a nozzle required during work in the mounter "NXT-1" is accommodated in nozzle tray 76 of "ND36C" due to operations of pallet accommodation device 92, nozzle transfer device 94, and the like in accordance with the above-described procedure.

However, there is a case where the operator does not set nozzle tray 76 having tray name 240 displayed on setup change screen 220 in fixing stage 131 corresponding to selection button 230, 232, or 234 associated with tray name 240. That is, when setup change screen 220 illustrated in FIG. 8 is displayed on touch panel 86, the operator may erroneously set nozzle tray 76 of "ND36C" in center stage 131. In such a case, nozzle tray 76 of "ND36C" may accommodate a nozzle required during work in the mounter "NXT-2", instead of a nozzle required during work in the mounter "NXT-1". Since nozzle tray 76 of "NA74A" is used in the mounter "NXT-2", there is concern that a nozzle required during work in the mounter "NXT-2" cannot be accommodated in nozzle tray 76 of "ND36C".

In view of this, when nozzle tray 76 is set in fixing stage 131, it is checked whether nozzle tray 76 is set in accordance with the display of setup change screen 220. Specifically, when nozzle tray 76 is set in fixing stage 131, camera 126 is moved above set nozzle tray 76 due to an operation of head moving device 122 and images nozzle tray 76. In this case, controller 202 analyzes 2D code 78 written on nozzle tray 76 based on imaging data obtained through the imaging, and acquires an ID of nozzle tray 76. Controller 202 specifies the name of set nozzle tray 76 by using the acquired ID of nozzle tray 76. Consequently, controller 202 checks whether nozzle tray 76 is set in accordance with the display of setup change screen 220. That is, when the name of the nozzle tray set in left stage 131 is specified to be "ND36C", it is determined that nozzle tray 76 of "ND36C" is set in accordance with the display of setup change screen 220. When it is determined that nozzle tray 76 of "ND36C" is set in accordance with the display of setup change screen 220, a nozzle required during work in the mounter "NXT-1" is accommodated in nozzle tray 76. Consequently, a nozzle required during work in a mounter associated with nozzle tray 76 can be appropriately accommodated in nozzle tray 76.

As described above, the mounter information of mounter name 242 of "NXT-1" is stored in memory 208 in correlation with the tray information of the two types of tray names 240 of "ND32C" and "ND36C". Therefore, as illustrated in FIG. 7, the two types of tray names 240 of "ND32C" and "ND36C" are displayed on change screen 250 in correspondence to mounter name 242 of "NXT-1". As illustrated in FIG. 8, tray names 240 of "ND32C/ND36C" are displayed in correspondence to first selection button 230 on setup change screen 220, and thus the operator recognizes that nozzle tray 76 of "ND32C" or the nozzle tray of "ND36C" can be set in left stage 131.

However, it is necessary to change the display of tray name 240 according to the number of suction nozzles 60 accommodated in nozzle tray 76. Specifically, nozzle tray 76 of "ND32C" can accommodate a maximum of 32 suction nozzles 60, and nozzle tray 76 of "ND36C" can accommodate a maximum of 36 suction nozzles 60. Therefore, when the number of nozzles required during work in the mounter "NXT-1" displayed together with the two types of tray names "ND32C" and "ND36C" is 32 or less, all of the nozzles required during work can be accommodated in the nozzle tray regardless of which nozzle tray "ND32C" or "ND36C" is set in the fixing stage. However, when the number of nozzles required during work in the mounter "NXT-1" exceeds 32, all of the nozzles required during work cannot be accommodated in the nozzle tray in a case where the nozzle tray "ND32C" is set in the fixing stage.

Therefore, in a case where two or more types of nozzle trays 76 are included in the tray information stored in memory 208 in correlation with the mounter information, controller 202 specifies the nozzle information stored in memory 208 in correlation with the mounter information, and specifies the number of nozzles required during work based on the nozzle information. Controller 202 determines whether the maximum accommodation number of suction nozzles in each of the two or more types of nozzle trays 76 included in the tray information is equal to or larger than the number of nozzles required during work. Controller 202 displays, on change screen 250, the name of nozzle tray 76 in which the maximum accommodation number of suction nozzles is equal to or larger than the number of nozzles required during work. Consequently, only tray name that can accommodate all of the nozzles required during work among the two or more types of nozzle trays 76 included in the tray information is displayed on change screen 250.

Specifically, for example, in a case where the number of nozzles required during work is specified to be 30 based on the nozzle information stored in memory 208 in correlation with the mounter information of the mounter "NXT-1", all of the nozzles required during work can be accommodated in either nozzle tray 76 of "ND32C" and "ND36C". Thus, as illustrated in FIG. 7, the two types of tray names 240 of "ND32C/ND36C" are displayed on change screen 250 in correspondence to mounter name 242 of "NXT-1". When tray name 240 is selected, as illustrated in FIG. 8, tray names 240 of "ND32C/ND36C" are displayed on setup change screen 220 in correspondence to first selection button 230.

Figure 9:
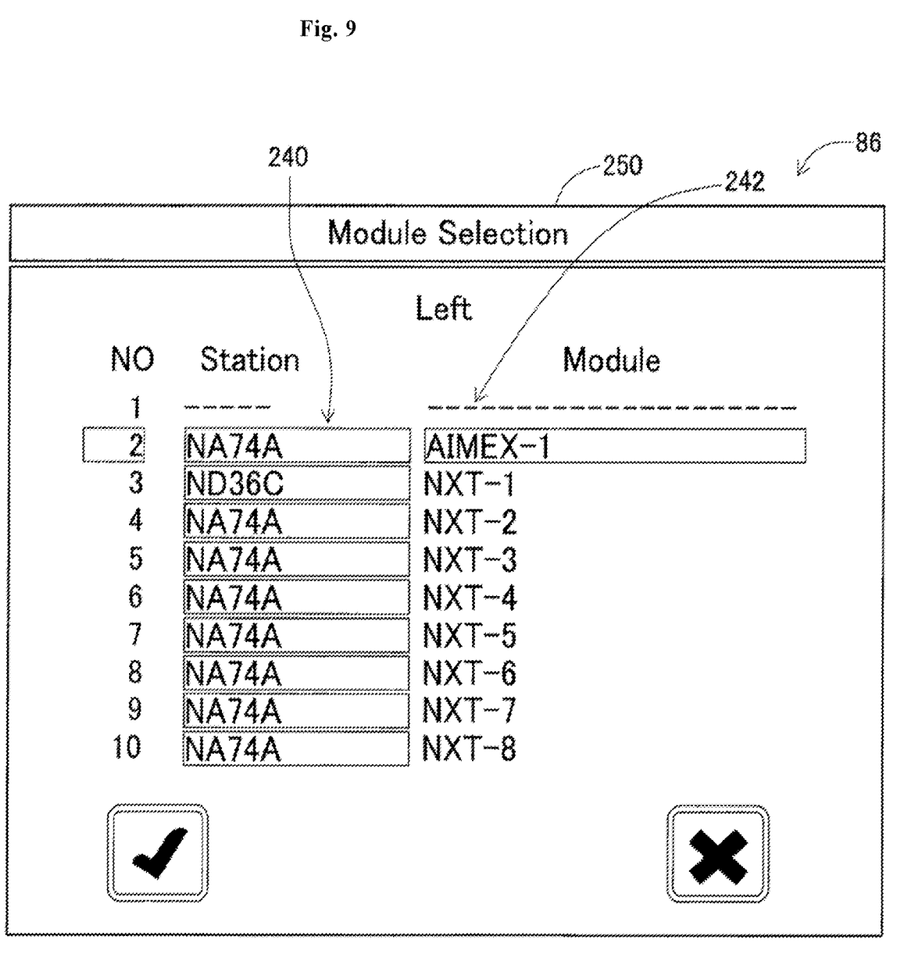
FIG. 9 is a diagram illustrating a change screen.
Figure 10:
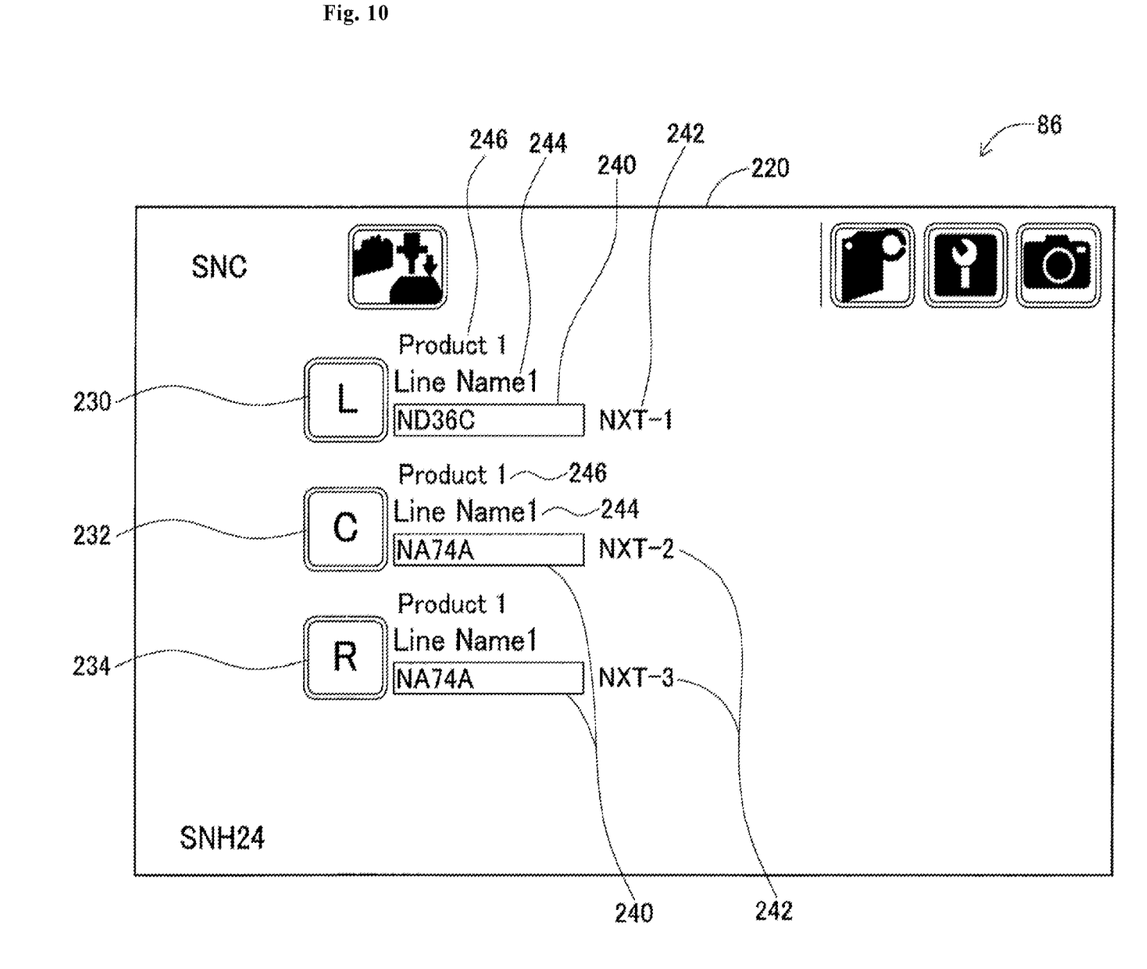
FIG. 10 is a diagram illustrating a setup change screen.

On the other hand, for example, in a case where the number of nozzles required during work is specified to be 35 based on the nozzle information, all of the nozzles required during work can be accommodated in nozzle tray 76 of "ND36C", but not all of the nozzles required during work can be accommodated in nozzle tray 76 of "ND32C". Thus, as illustrated in FIG. 9, tray name 240 of "ND36C" is displayed on change screen 250 in correspondence to mounter name 242 of "NXT-1". When tray name 240 is selected, as illustrated in FIG. 10, tray name 240 of "ND36C" is displayed on setup change screen 220 in correspondence to first selection button 230.

As described above, in a case where two or more types of nozzle trays 76 are included in the tray information, only tray name that can accommodate all of the nozzles required during work among the two or more types of nozzle trays 76 is displayed on change screen 250 and setup change screen 220. Consequently, in a case where the operator sets nozzle tray 76 in fixing stage 131 in accordance with the display of setup change screen 220, it is possible to secure appropriate work of accommodating nozzles required during work in set nozzle tray 76.

Mounter 14 is an example of a work machine. Suction nozzle 60 is an example of a component holder. Nozzle tray 76 is an example of a tray. Nozzle management device 80 is an example of a holder management device. Touch panel 86 is an example of a display device. Nozzle transfer device 94 is an example of a transfer device. Fixing stage 131 is an example of a placement section. Controller 202 is an example of a determination device. Memory 208 is an example of a storage device.

Thus, the above-described present embodiment achieves the following effects.

In nozzle management device 80, in a case where two or more types of nozzle trays are included in tray information, mounter name 242 of a mounter indicated by mounter information stored in memory 208 in correlation with the tray information and tray name 240 of the two or more types of nozzle trays included in the tray information are displayed in correlation with each other on setup change screen 220. Consequently, since an operator can set any nozzle tray among multiple types of nozzle trays in fixing stage 131, the efficiency is improved by increasing the number of options for the operator.

A maximum of 32 suction nozzles 60 can be accommodated in nozzle tray 76 of "ND32C", and a maximum of 36 suction nozzles 60 can be accommodated in nozzle tray 76 of "ND36C". In a case where the number of nozzles required during work in a mounter that is a target of the setup change task, that is, the mounter "NXT-1" is 32 or less, the two types of tray names 240 of "ND32C/ND36C" are displayed on setup change screen 220. On the other hand, when the number of nozzles required during work in the mounter "NXT-1" is not 32 or less, tray name 240 of "ND32C" is not displayed on setup change screen 220, and tray name 240 of "ND36C" is displayed. Consequently, it is possible to secure an appropriate work of accommodating nozzles required during work in nozzle tray 76.

Controller 202 determines whether nozzle tray 76 set in fixing stage 131 is set in accordance with the display of setup change screen 220. In a case where nozzle tray 76 is set in fixing stage 131 in accordance with the display of setup change screen 220, work for accommodating the nozzles required during work in nozzle tray 76 is executed. Consequently, a nozzle required during work in a mounter associated with nozzle tray 76 can be appropriately accommodated in nozzle tray 76.

The present disclosure is not limited to the above embodiment, and can be implemented in various forms where various modifications and improvements are made based on the knowledge of those skilled in the art. Specifically, for example, although the present disclosure is applied to a method of displaying the name of nozzle tray 76 that accommodates suction nozzle 60 on touch panel 86 in the above embodiment, the present disclosure may be applied to a method of displaying the name of a tray that accommodates a component holder capable of holding a component. Specifically, as the component holder, for example, a gripper that grips a component with multiple pawls, a so-called chuck, may be employed.

In the above embodiment, the two types of nozzle trays 76 of "ND32C/ND36C" are stored in memory 208 in correlation with the mounter information as the nozzle information, but three or more types of nozzle trays 76 may be stored in memory 208 in correlation with the mounter information as the nozzle information. In such a case, three or more types of tray names 240 are displayed on setup change screen 220 and change screen 250.

In the above embodiment, tray name 240 and mounter name 242 are displayed on setup change screen 220 or the like, but information indicating nozzle tray 76 and information indicating a mounter in which nozzle tray 76 is set may be displayed. That is, as long as information for identifying nozzle tray 76 or information for identifying a mounter, for example, various symbols, marks, and codes may be displayed on setup change screen 220 or the like.

REFERENCE SIGNS LIST

14: Mounter (work machine), 60: Suction nozzle (component holder), 76: Nozzle tray (tray), 80: Nozzle management device (holder management device), 86: Touch panel (display device), 94: Nozzle transfer device (transfer device), 131: Fixing stage (placement section), 202: Controller (determination device), 208: Memory (storage device)

The invention claimed is:
1. A holder management device comprising:
 a storage device configured to store a tray in which a component holder is accommodated and a work machine that performs work by using the component holder accommodated in the tray in correlation with each other;
 a placement section on which the tray is placed;
 a transfer device configured to transfer the component holder used in the work machine stored in the storage device in correlation with the tray to the tray placed on the placement section; and
 a display device configured to display information indicating a tray to be placed on the placement section together with information indicating a work machine stored in the storage device in correlation with the tray, and in a case where the storage device stores multiple types of trays and work machines in correlation with each other, to display information indicating the multiple types of trays together with information indicating the work machines stored in the storage device in correlation with the multiple types of trays.

2. The holder management device according to claim 1, wherein in a case where the storage device stores, as the multiple types of trays, a first tray configured to accommodate a predetermined number of component holders and a second tray configured to accommodate a larger number of component holders than the predetermined number, the display device displays information indicating the first tray and the second tray on condition that the number of component holders scheduled to be transferred by the transfer device to the tray placed on the placement section is equal to or smaller than the predetermined number.

3. The holder management device according to claim 2, wherein
the display device does not display information indicating the first tray and displays information indicating the second tray in a case where the number of component holders scheduled to be transferred by the transfer device to the tray placed on the placement section is not equal to or smaller than the predetermined number.

4. The holder management device according to claim 1, further comprising:
a determination device configured to determine whether the tray placed on the placement section is a type of tray displayed on the display device, wherein
in a case where the determination device determines that the tray placed on the placement section is the type of tray displayed on the display device, the transfer device transfers the component holder to the tray placed on the placement section.

5. A display method in a holder management device including a storage device configured to store a tray in which a component holder is accommodated and a work machine that performs work by using the component holder accommodated in the tray in correlation with each other, a placement section on which the tray is placed, a display device configured to display information indicating a tray to be placed on the placement section together with information indicating a work machine stored in the storage device in correlation with the tray, and a transfer device configured to transfer the component holder used in the work machine stored in the storage device in correlation with the tray to the tray placed on the placement section, the display method comprising:
displaying, in a case where the storage device stores multiple types of trays and work machines in correlation with each other, information indicating the multiple types of trays together with information indicating the work machines stored in the storage device in correlation with the multiple types of trays on the display device.

* * * * *